US011257682B2

(12) United States Patent
Young et al.

(10) Patent No.: US 11,257,682 B2
(45) Date of Patent: Feb. 22, 2022

(54) MOLECULAR LAYER ETCHING

(71) Applicant: UCHICAGO ARGONNE, LLC, Chicago, IL (US)

(72) Inventors: Matthias John Young, Lemont, IL (US); Steven Payonk Letourneau, Naperville, IL (US); Devika Choudhury, Naperville, IL (US); Jeffrey W. Elam, Elmhurst, IL (US); Angel Yanguas-Gil, Northbrook, IL (US); Anil U. Mane, Lemont, IL (US)

(73) Assignee: UChicago Argonne, LLC, Chicago, IL (US)

( * ) Notice: Subject to any disclaimer, the term of this patent is extended or adjusted under 35 U.S.C. 154(b) by 0 days.

(21) Appl. No.: 16/588,176

(22) Filed: Sep. 30, 2019

(65) Prior Publication Data
US 2021/0098262 A1 Apr. 1, 2021

(51) Int. Cl.
H01L 21/311 (2006.01)
H01L 21/027 (2006.01)
H01L 21/033 (2006.01)
H01L 21/02 (2006.01)

(52) U.S. Cl.
CPC .... H01L 21/31116 (2013.01); H01L 21/0228 (2013.01); H01L 21/0272 (2013.01); H01L 21/02178 (2013.01); H01L 21/02205 (2013.01); H01L 21/0331 (2013.01); H01L 21/31138 (2013.01)

(58) Field of Classification Search
None
See application file for complete search history.

(56) References Cited

U.S. PATENT DOCUMENTS

2017/0365478 A1* 12/2017 George .................... C23F 1/12
2018/0080124 A1*  3/2018 Bajaj ...................... C23C 16/52

OTHER PUBLICATIONS

"7nm Technology," Taiwan Semiconductor Manufacturing Company, retrieved from https://www.tsmc.com/english/dedicatedFoundry/technology/7nm.htm#, 1 page (2019).
Abdulagatov & George, "Thermal Atomic Layer Etching of Silicon Using O2, HF, and Al(CH3)3 as the Reactants," Chemistry of Materials 30(23), pp. 8465-8475 (2018).
Baggott, et al., "CH local modes in cyclobutene—I. FTIR studies 700-9000 cm-1," Spectrochimica Acta Part A: Molecular Spectroscopy 42(2-3), pp. 319-334 (1986).
Biswas, et al., "New Insight into the Mechanism of Sequential Infiltration Synthesis from Infrared Spectroscopy," Chemistry of Materials 26(21), pp. 6135-6141 (2014).
Comstock & Elam, "Mechanistic Study of Lithium Aluminum Oxide Atomic Layer Deposition," The Journal of Physical Chemistry C 117(4), pp. 167-1683 (2013).

(Continued)

Primary Examiner — Stephanie P Duclair
(74) Attorney, Agent, or Firm — Foley & Lardner LLP

(57) ABSTRACT

A method of etching an organic or hybrid inorganic/organic material. The method etches molecular layer deposition coatings. An etching cycle comprises a first half reaction exposing the coating to a precursor. A second half reaction exposes a second precursor, removing or etching a portion of the coating.

15 Claims, 8 Drawing Sheets

(56) References Cited

OTHER PUBLICATIONS

Dameron, et al., "Molecular Layer Deposition of Alucone Polymer Films Using Trimethylaluminum and Ethylene Glycol," Chemistry of Materials 20(10), pp. 3315-3326 (2008).
Dumont, et al., "Thermal Atomic Layer Etching of SiO2 by a 'Conversion-Etch' Mechanism Using Sequential Reactions of Trimethylaluminum and Hydrogen Fluoride," ACS Applied Materials & Interfaces 9(11), pp. 10296-10307 (2017).
Elam, et al., "Viscous Flow Reactor with Quartz Crystal Microbalance for Thin Film Growth by Atomic Layer Deposition," Review of Scientific Instruments 73(8), pp. 2981-2987 (2002).
Fraser, et al., "Acidity measurements on pyridines in tetrahydrofuran using lithiated silylamines," The Journal of Organic Chemistry 50(17), pp. 3232-3234 (1985).
George & Lee, "Prospects for Thermal Atomic Layer Etching Using Sequential, Self-Limiting Fluorination and Ligand-Exchange Reactions," ACS Nano 10(5), pp. 4889-4894 (2016).
George, "Atomic Layer Deposition: An Overview," chemical reviews 110, pp. 111-131 (2010).
George, et al., "Surface Chemistry for Molecular Layer Deposition of Organic and Hybrid Organic-Inorganic Polymers," Accounts of Chemical Research 42(4), pp. 498-508 (2009).
Gong & Parsons, "Quantitative in situ infrared analysis of reactions between trimethylaluminum and polymers during Al2O3 atomic layer deposition," Journal of Materials Chemistry 22(31), pp. 15672-15682 (2012).
Hisamoto, et al., "Impact of the vertical SOI 'DELTA' structure on planar device technology," IEEE Transactions on Electron Devices 38(6), pp. 1419-1424 (1991).
Johnson & George, "WO3 and W Thermal Atomic Layer Etching Using 'Conversion-Fluorination' and 'Oxidation-Conversion-Fluorination' Mechanisms," ACS Applied Materials & Interfaces 9(39), pp. 34435-34447 (2017).
Korppi-Tommola, "Tert-butyl alcohol—matrix i.r. spectra and vibrational assignment," Spectrochimica Acta Part A: Molecular Spectroscopy 34(11), pp. 1077-1085 (1978).
Kubono & Okui, "Polymer thin films prepared by vapor deposition," Progress in Polymer Science 19(3), pp. 389-438 (1994).
Lee & George, "Thermal Atomic Layer Etching of Titanium Nitride Using Sequential, Self-Limiting Reactions: Oxidation to TiO2 and Fluorination to Volatile TiF4," Chemistry of Materials 29(19), pp. 8202-8210 (2017).
Lee, et al., "Alucone Alloys with Tunable Properties Using Alucone Molecular Layer Deposition and Al2O3 Atomic Layer Deposition," The Journal of Physical Chemistry C 116(5), pp. 3250-3257 (2012).
Lee, et al., "Atomic Layer Deposition of AlF3 Using Trimethylaluminum and Hydrogen Fluoride," The Journal of Physical Chemistry C 119(25), pp. 14185-14194 (2015).
Lee, et al., "Atomic Layer Deposition of Metal Fluorides Using HF-Pyridine as the Fluorine Precursor," Chemistry of Materials 28(7), pp. 2022-2032 (2016).
Lee, et al., "Atomic Layer Etching of AlF3 Using Sequential, Self-Limiting Thermal Reactions with Sn(acac)2 and Hydrogen Fluoride," The Journal of Physical Chemistry C 119(45), pp. 25385-25393 (2015).
Lee, et al., "Atomic Layer Etching of HfO2 Using Sequential, Self-Limiting Thermal Reactions with Sn(Acac)2 and HF," ECS Journal of Solid State Science and Technology 4(6), pp. N5013-N5022 (2015).
Lee, et al., "Mechanism of Thermal Al2O3 Atomic Layer Etching Using Sequential Reactions with Sn(acac)2 and HF," Chemistry of Materials 27(10), pp. 3648-3657 (2015).
Lee, et al., "Selectivity in Thermal Atomic Layer Etching Using Sequential, Self-Limiting Fluorination and Ligand-Exchange Reactions," Chemistry of Materials 28(21), pp. 7657-7665 (2016).
Lee, et al., "Trimethylaluminum as the Metal Precursor for the Atomic Layer Etching of Al2O3 Using Sequential, Self-Limiting Thermal Reactions," Chemistry of Materials 28(9), pp. 2994-3003 (2016).
Lemaire & Parsons, "Thermal Selective Vapor Etching of TiO2: Chemical Vapor Etching via WF6 and Self-Limiting Atomic Layer Etching Using WF6 and BCl3," Chemistry of Materials 29(16), pp. 6653-6665 (2017).
Meng, et al., "Vapor-Phase Atomic-Controllable Growth of Amorphous Li2S for High-Performance Lithium-Sulfur Batteries," ACS Nano 8(10), pp. 10963-10972 (2014).
Moore, "Cramming More Components Onto Integrated Circuits," Electronics 38(8), 4 pages (1965).
Singh, et al., "High-performance fully depleted silicon nanowire (diameter /spl les/ 5 nm) gate-all-around CMOS devices," IEEE Electron Device Letters 27(5), pp. 383-386 (2006).
Wetzel & Brauman, "Quantitative measure of alpha-silyl carbanion stabilization. The electron affinity of (trimethylsilyl)methyl radical," Journal of the American Chemical Society 110(25), pp. 8333-8336 (1988).
Wilson, et al,. "Nucleation and Growth during Al2O3 Atomic Layer Deposition on Polymers," Chemistry of Materials 17(23), pp. 5625-5634 (2005).
Wind & George, "Quartz Crystal Microbalance Studies of Al2O3 Atomic Layer Deposition Using Trimethylaluminum and Water at 125?C," The Journal of Physical Chemistry A 114(3), pp. 1281-1289 (2010).
Yacovitch, et al., "Slow Photoelectron Velocity-Map Imaging of the i-Methylvinoxide Anion," The Journal of Physical Chemistry A 114(42), pp. 11091-11099 (2010).
Yanguas-Gil, et al., "Modulation of the Growth Per Cycle in Atomic Layer Deposition Using Reversible Surface Functionalization," Chemistry of Materials 25(24), pp. 4849-4860 (2013).
Yoon, et al., "Molecular Layer Deposition of Hybrid Organic-Inorganic Polymer Films using Diethylzinc and Ethylene Glycol," Chemical Vapor Deposition 15(4-6), pp. 112-121 (2009).
Yoshimura, et al., "Polymer films formed with monolayer growth steps by molecular layer deposition," Applied Physics Letters 59(4), pp. 482-484 (1991).
Zywotko & George, "Thermal Atomic Layer Etching of ZnO by a 'Conversion-Etch' Mechanism Using Sequential Exposures of Hydrogen Fluoride and Trimethylaluminum," Chemistry of Materials 29(3), pp. 1183-1191 (217).
Atiya, et al., "Vibrational spectra of monomeric trimethylaluminium and trimethylgallium," Spectrochimica Acta Part A: Molecular Spectroscopy 47(3-4), pp. 467-476 (1991).
Kvisle & Rytter, "Infrared matrix isolation spectroscopy of trimethylgallium, trimethylaluminium and triethylaluminium," Spectrochimica Acta Part A: Molecular Spectroscopy 40(10), pp. 939-951 (1984).
Lee, et al., "Growth and Properties of Hybrid Organic-Inorganic Metalcone Films Using Molecular Layer Deposition Techniques," Advanced Functional Materials 23(5), pp. 532-546 (2013).
O'Brien & Ozin, "A gas-phase Raman study of trimethylaluminium and trimethylboron monomers," Journal of the Chemical Society A: Inorganic, Physical, Theoretical, pp. 1136-1138 (1971).
Park, et al., "Gas diffusion barrier characteristics of Al2O3/alucone films formed using trimethylaluminum, water and ethylene glycol for organic light emitting diode encapsulation," Thin Solid Films 546, pp. 153-156 (2013).
Tabassum, et al., "Hindered Bronsted bases as Lewis base catalysts," Organic & Biomolecular Chemistry 7(19), pp. 4009-4016 (2009).
Lee & George, "Atomic Layer Etching of Al2O3 Using Sequential, Self-Limiting Thermal Reactions with Sn(acac)2 and Hydrogen Fluoride," ACS Nano 9(2), pp. 2061-2070 (2015).
Miikkulainen, et al., "Crystallinity of inorganic films grown by atomic layer deposition: Overview and general trends," Journal of Applied Physics 113(2), 021301, 101 pages (2013).
Puurunen, "A Short History of Atomic Layer Deposition: Tuomo Suntola's Atomic Layer Epitaxy," Chemical Vapor Deposition 20(Oct. 11, 2012), pp. 332-344 (2014).

* cited by examiner

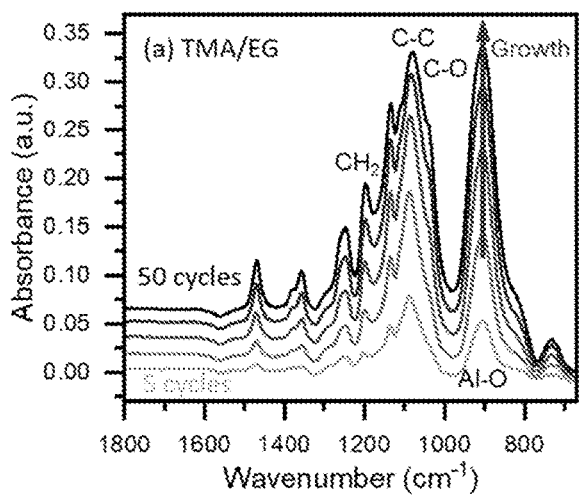
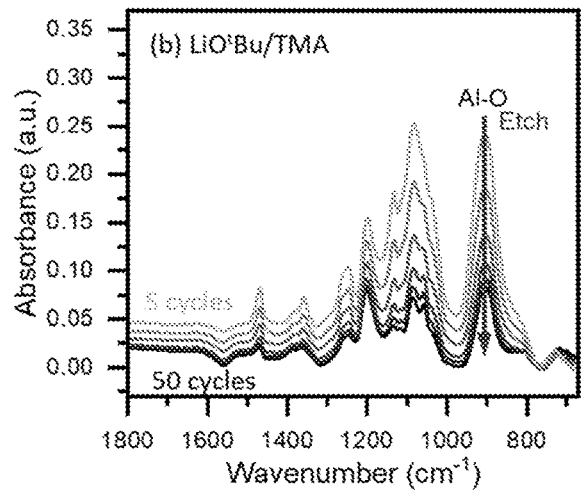
FIGURE 2A
FIGURE 2B
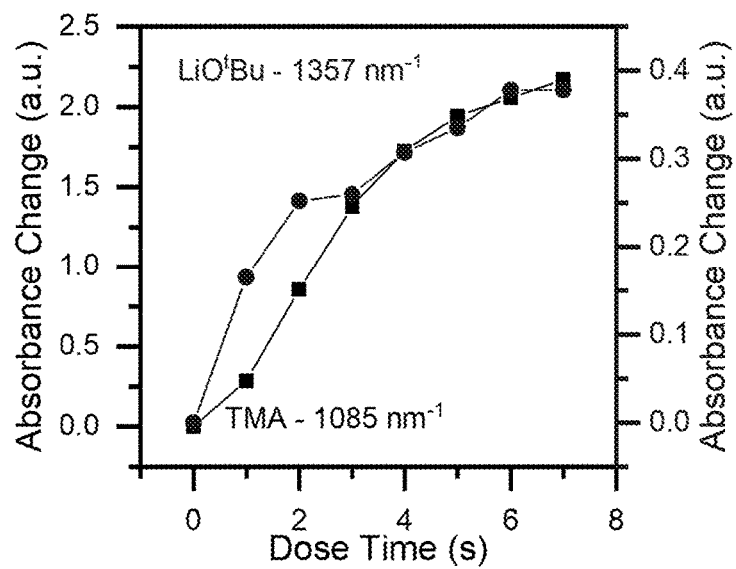
FIGURE 3

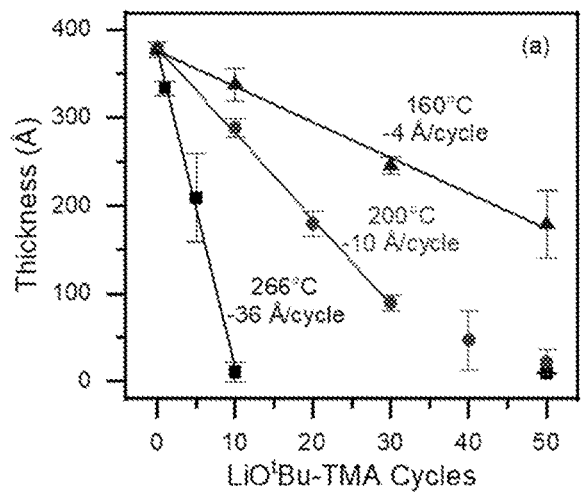
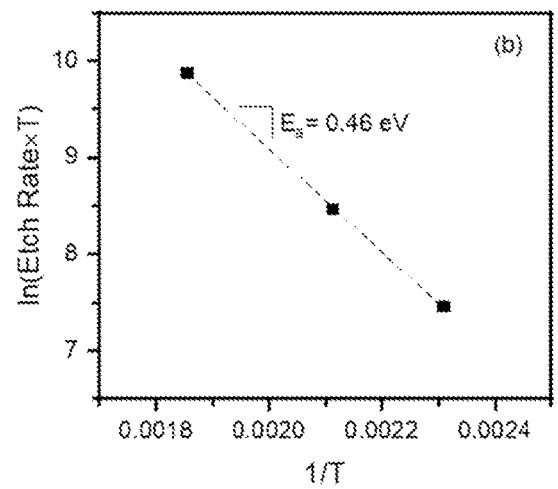
FIGURE 4A
FIGURE 4B
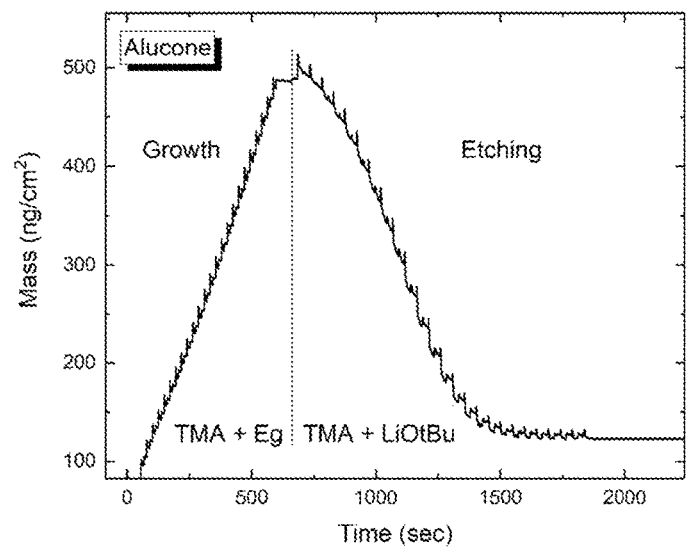
FIGURE 5A

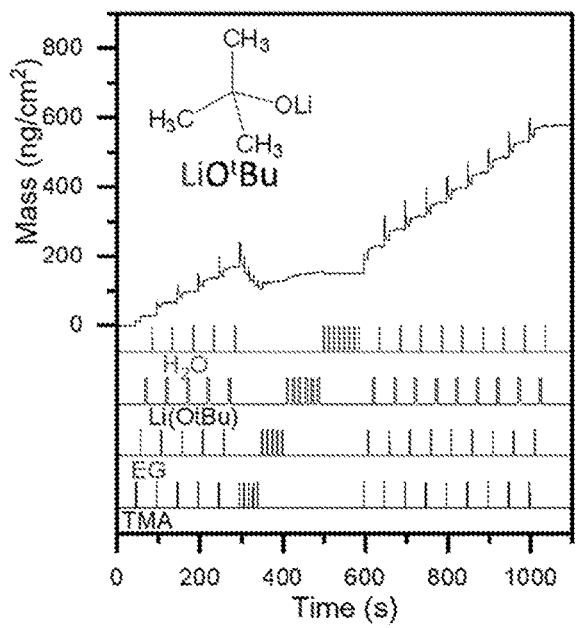
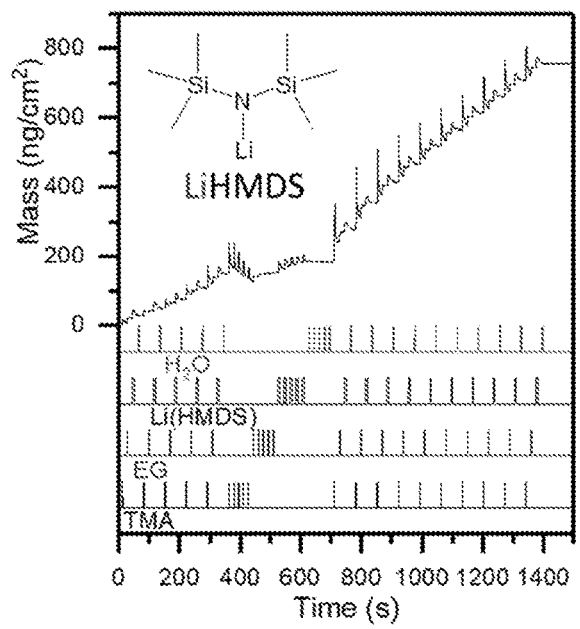
FIGURE 7A
FIGURE 7B
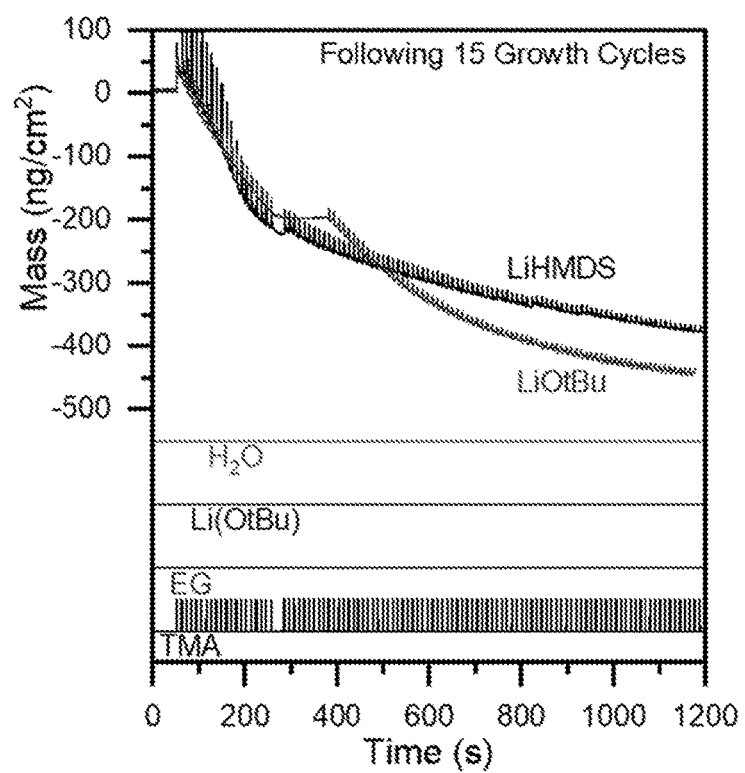
FIGURE 8

MOLECULAR LAYER ETCHING

STATEMENT OF GOVERNMENT INTEREST

This invention was made with government support under Contract No. DE-AC02-06CH11357 awarded by the United States Department of Energy to UChicago Argonne, LLC, operator of Argonne National Laboratory. The government has certain rights in the invention.

TECHNICAL FIELD

The present disclosure relates to synthesis methods. More particularly, the present disclosure relates to systems, methods, and compositions oxide.

BACKGROUND

Small scale etching is a critical technique for many modern fabrication techniques. Soft materials are commonly used as masks for photolithography processes and in various stages of semiconductor and microelectronic device manufacturing. The ability to etch away soft materials (e.g., polymeric or metal-organics) in a controlled, layer-by-layer fashion on the sub-nanometer-length scale promises to enable new fabrication techniques for these manufacturing processes and ultimately enable more energy-efficient and high-performance microelectronics and semiconductor devices.

Recently, researchers have established the capability for atomic layer etching ("ALE") (i.e., material removal atomic-layer by atomic-layer) of metal oxides using gas-phase sequential, self-limiting exposures of hydrofluoric acid ("HF") and metal organic precursors. While commercial interest in ALE within the semiconductor community is immense, the use of HF poses safety concerns, the etch rates in ALE processes are limited (~1 Angstrom/cycle), and the ability to remove soft materials (polymers, metal organics, etc.) has not been demonstrated. These represent non-trivial barriers to the use of ALE for many materials and in many applications. Thus, there remains a need for a process an HF-free chemistry to remove molecular layers of metal-organic films with sub-nanometer thickness control.

SUMMARY

At least one embodiment relates to a method of etching an organic/inorganic hybrid coating on an inorganic substrate. The method comprises performing an etching cycle. The etching cycle comprises a first half reaction and a second half reaction. The first half reaction exposes a first etching precursor comprising a gaseous lithium precursor to the coating on the substrate at a first half reaction temperature, the coating being selected from the group consisting of an organic coating and an organic-inorganic coating. The second half reaction exposes a second etching precursor, which comprises trimethylaluminum, to the coating at a second half reaction temperature. A portion of the organic/inorganic coating is removed.

Another embodiment relates to a method of forming an object. The method comprises a deposition cycle and an etching cycle. The deposition cycle comprises: exposing a first deposition precursor to the substrate; exposing a second deposition precursor to the substrate; and repeating the deposition cycle N times, forming a coating on the substrate. The etching cycle comprises a first half reaction and a second half reaction wherein a portion of the coating is removed. The first half reaction exposes a first etching precursor comprising a lithium precursor to the coating on the substrate, the coating being selected from the group consisting of an organic coating and an organic-inorganic coating. The second half reaction exposes a second etching precursor, which comprises an organometallic, to the coating.

This summary is illustrative only and is not intended to be in any way limiting. Other aspects, inventive features, and advantages of the devices or processes described herein will become apparent in the detailed description set forth herein, taken in conjunction with the accompanying figures, wherein like reference numerals refer to like elements.

BRIEF DESCRIPTION OF THE FIGURES

FIGS. 2A-2B show in-situ Fourier transform infra-red ("FTIR") spectroscopy of MLD growth of alucone using TMA/EG exposures (FIG. 2A) followed by MLE using LiO$^t$Bu/TMA exposures (FIG. 2B).

FIG. 3 shows FTIR spectroscopy of saturation in absorbance changes for both TMA and LiO$^t$Bu dose times (self-limiting chemistry for both of the MLE steps).

FIGS. 4A-4B show a study of temperature dependence on etch rate of alucone using LiO$^t$Bu/TMA including (a) thickness of alucone films with initial thickness of 377 nm following LiO$^t$Bu/TMA exposures between 160° C. and 266° C. as measured using spectroscopic ellipsometry on silicon wafers and (b) Arrhenius analysis of etch rate.

FIGS. 5A-5D show etching demonstrated on four types of metal cones ("M-cones"). The etching rate is dependent on the type of M-cone.

FIGS. 7A-7B show QCM measurements during MLD growth of TMA:EG:LiO$^t$Bu:H$_2$O (FIG. 7A) and TMA:EG:LiHMDS:H$_2$O (FIG. 7B) including multidoses following 5 ALD cycles to measure saturation behavior.

FIG. 8 shows QCM mass changes during TMA doses performed after 15 growth cycles of TMA:EG:Li-precursor:H$_2$O.

FIG. 9A shows the impact of water during a growth process while FIG. 9B shows the impact during an etching process.

DETAILED DESCRIPTION

Figure 1A:
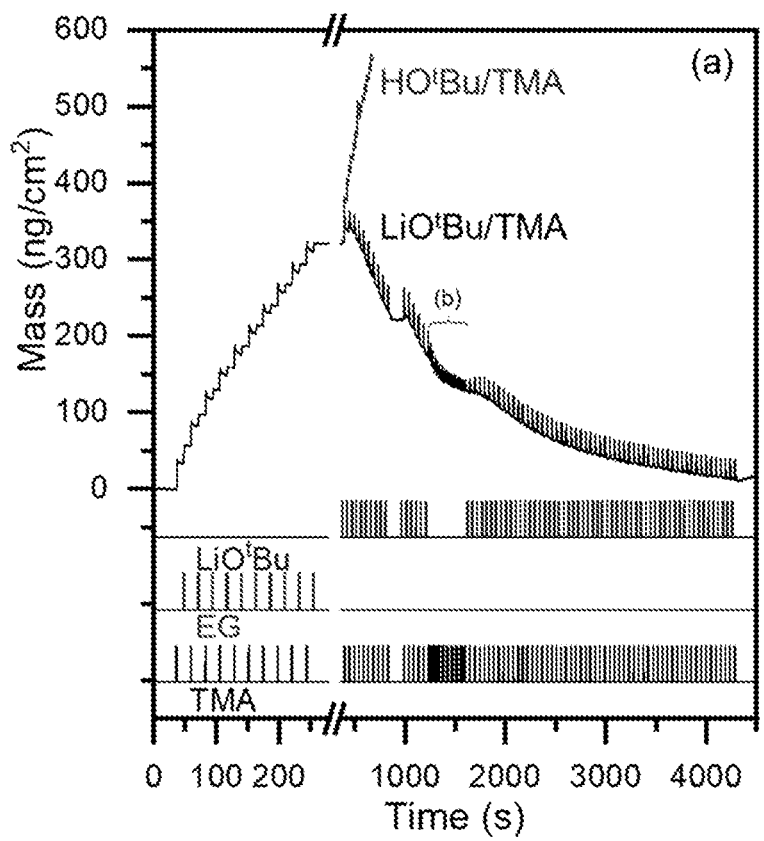
FIG. 1A shows in situ quartz crystal microbalance ("QCM") measurements of molecular layer deposition ("MLD") growth of alucone using trimethylaluminum ("TMA")/ethylene glycol ("EG") exposures followed by molecular layer etching ("MLE") using 100 exposures of lithium tert-butoxide ("LiO$^t$Bu")/TMA exposures.

Before turning to the figures, which illustrate certain exemplary embodiments in detail, it should be understood that the present disclosure is not limited to the details or methodology set forth in the description or illustrated in the figures. It should also be understood that the terminology used herein is for the purpose of description only and should not be regarded as limiting.

Some embodiments relate to a gas phase thermal chemical process which enables the removal of metal organic thin films deposited by MLD through an etching process. The MLE process takes place in MLD films upon chemical exposures to precursors (in the examples below, TMA and a lithium organic salt ("LOS") (LiO$^t$Bu or lithium hexamethyldisilizane ("LiHMDS"))). As the experiments described below illustrate, the process provides for (a) the rapid removal of bulk alucone films predoped with a LOS using TMA exposures and (b) the precise layer-by-layer removal of alucone films using sequential, self-limiting exposures of TMA and a LOS. In operando FTIR and QCM experiments suggest that the etching mechanism initiates by LOS (e.g., LiO$^t$Bu) heterolytically cleaving Al—O bonds in the R—Al—OC$_2$H$_4$O—Al—R alucone structure to form R—Al-OtBu and Li—OC$_2$H$_4$O—Al—R groups. Then, upon TMA exposure, the Al atoms in these alucone groups are methylated to generate volatile species. MLE is verified on silicon wafers and produce etch rates of 0.4 nm/cycle at 160° C. up to 3.6 nm/cycle at 266° C. We also observe the ability to prevent the etching behavior by introducing water pulses during the MLD growth, suggesting that the etching mechanism is selective to the MLD films and is not active on ALD oxides.

As noted, ALE of metal oxides is limited to inorganic materials, has modest etch rates (~0.1 nm/cycle or lower), and utilizes compounds that may pose safety and environmental concerns (e.g., halogens). In general, the etch rate for ALE depends on the material to be etched as well as the etching temperature. ALE etch rate may vary from 0.01 nm to 0.4 nm/cycle depending on the temperature and the material. ALE proceeds through a traditional atomic layer deposition ("ALD") half-reaction, two-step process where a first precursor binds to the surface of the material to be etched (adsorption), the first precursor is purged, and then a second precursor (or co-reactant) is added to react with the adsorbed entity formed by the first precursor. The reaction of the second precursor removes the material deposited by the first precursor reaction, including material from the substrate, such as a single atom of the substrate. However, ALE is limited in its usage because it does not provide capabilities for etching soft materials (i.e., organics), as is desired. Soft materials are commonly used as masks for photolithography processes and in various stages of semiconductor and microelectronic device manufacturing. The ability to etch away soft materials (e.g., polymeric or metal-organics) in a controlled, layer-by-layer fashion on the sub-nanometer-length scale promises to enable new fabrication techniques for these manufacturing processes and ultimately enable more energy-efficient and high-performance microelectronics and semiconductor devices. Thermal ALE processes rely on the either the fluorination and ligand exchange mechanism or the conversion-flourination mechanism which requires the use of halogens (most commonly HF, others include BCl$_3$ etc).

Described herein are processes using and materials made by MLE that provide substantial, non-trivial, beneficial differences over ALE. MLE is an HF-free method and is thus safer than HF-etching methods. MLE also provides more rapid etch rates (e.g., 0.4-4 nm/cycle) and enables the removal of soft materials. MLE provides the ability for layer-by-layer removal of organic and inorganic/organic hybrid materials and allows for patterned etching due to its temperature dependency. The materials etched in some embodiments are organic or inorganic/organic hybrids are deposited by molecular layer deposition or MLD. MLD employs organic precursors to deposit organic or metal organic thin films. While initial reports on MLD focused on polymeric films, later efforts combined organic and organometallic precursors to form hybrid metal organic thin films by MLD. The first reported hybrid metal organic MLD chemistry employed TMA and EG to deposit a thin film material termed "alucone." Further studies reported the growth of a range of metal organic thin films, or "metalcones," by combining organometallic precursors and bifunctional organic molecules. These metalcone or M-cone films have lower elastic modulus that inorganic films, and have been found to enhance the barrier properties of ALD films.

Described herein is a technique by which metal-organic films can be removed in a molecular-layer-by-molecular-layer fashion with precise control over the thickness of the film removed. This will enable new fabrication pathways for microelectronics and semiconductor devices, both in conventional semiconductor manufacturing and in the emerging field of organic semiconductors.

In a first process, an organic or an organic-inorganic hybrid material, such as a M-cone, is grown/deposited on a substrate. For example, in one embodiment, MLD techniques are used to grow alucone using TMA and EG. FIG. 1A illustrates the growth of the alucone coating from successive cycles of TMA and EG. A standard alucone growth process was used. While the metal precursor in the metal precursor in the deposition step may be the same precursor as in the etching process, such is not required in some embodiments. M-cone films using different metal centers (e.g., Zn, Ti, etc.) can also be etched using the precursor combination of LiO$^t$Bu and TMA. Examples herein use the etching precursor combination (LiO$^t$Bu/LiHMDS+TMA) unless otherwise indicated.

In a second process, a coating—such as the resultant organic-inorganic hybrid coating of the above described M-cone process or another existing organic-inorganic material or an organic coating—is etched by a molecular etching process that involves a HF-free chemistry to remove molecular layers of metal-organic films with sub-nanometer thickness control. This chemistry is safer than HF-etching methods, provides more rapid etch rates (e.g., 4-40 Angstrom/cycle), and enables the removal of soft materials.

Figure 1B:
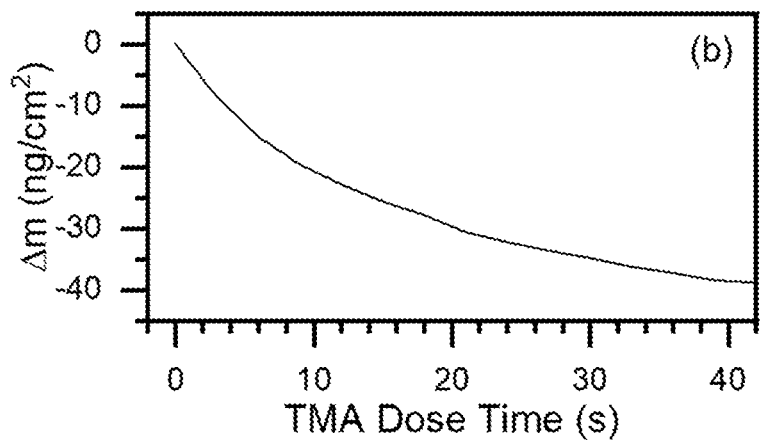
FIG. 1B shows QCM measurements of saturation in mass loss as a function of TMA dose time (self-limiting etching chemistry) observed during 40 successive 1 s TMA doses.
Figure 5B:
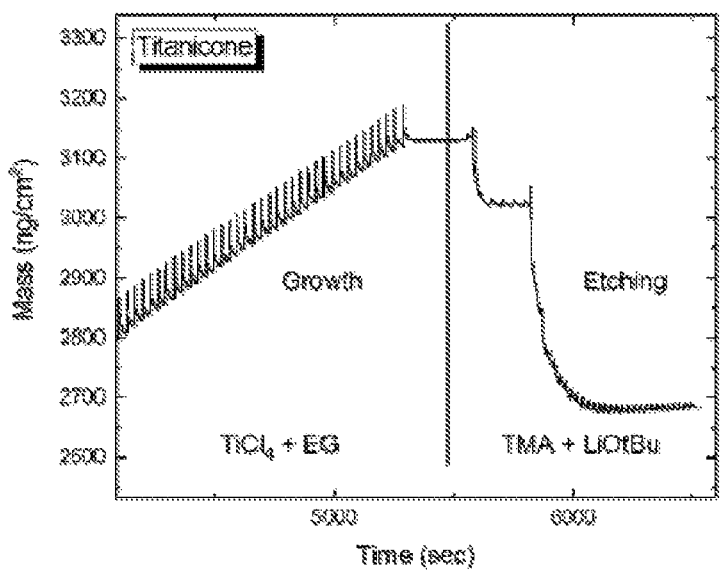
Figure 5C:
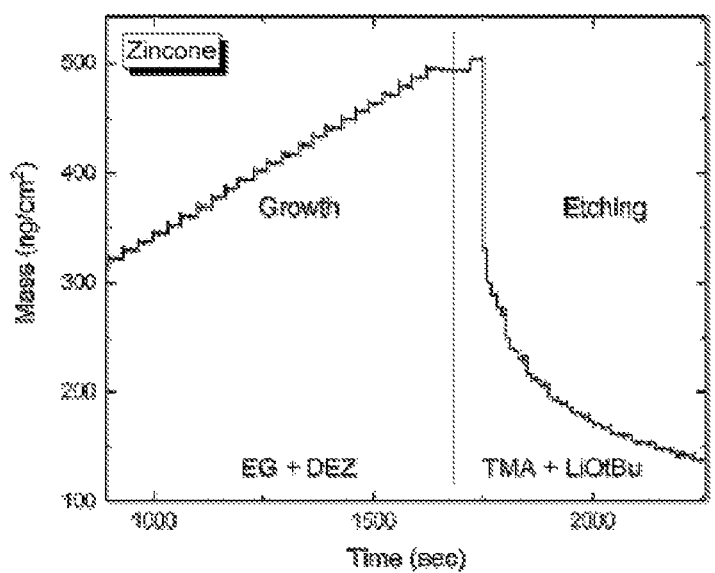
Figure 5D:
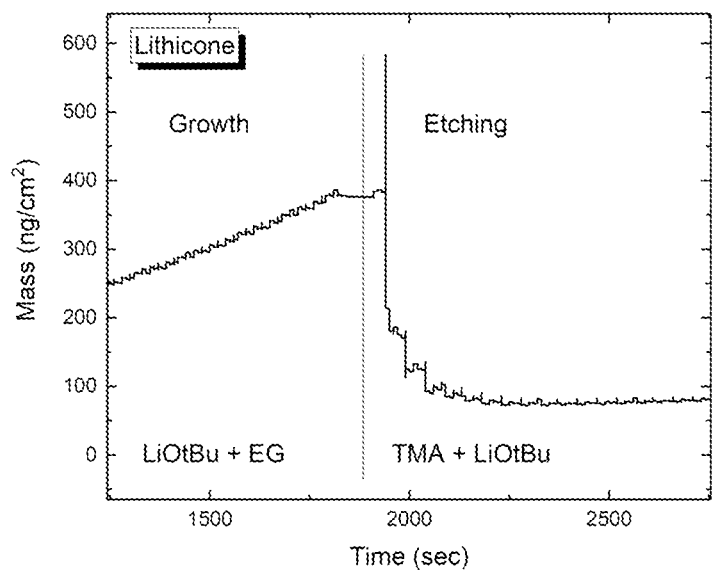

In one particular embodiment, the HF-free chemistry for the etch is accomplished with a step-wise etching cycle comprising a first half-reaction and a second half reaction, which may one or each be followed by a purge, such as by an inert gas. For the first half reaction, a gas phase first etch precursor, such as a lithium precursor (e.g., LiO$^t$Bu or LiHMDS) is utilized. The first etch precursor is reactive with the coating to form a first half-reaction product on the surface. A second etch precursor, such as a gaseous TMA, is exposed after the first etch precursor and reactive with the first half-reaction product. The exposures of the first etch precursor and the second etch precursor may be sequential, self-limiting gas phase exposures, preferably separated by purge steps, such as within a deposition reactor with a controlled pressure and temperature. The temperature of the reactor may be a first half reaction temperature and a second half reaction temperatures, which in some embodiments are between 150° C. and 300° C. (e.g., 160° C., 200° C. and 266° C.). The sequential process of exposing the first etching precursor and then exposing the TMA etch precursor results in the removal of exposed inorganic-organic material, such as by atomic layer thickness. FIG. 1B illustrates the etching reduction in mass caused by the exposure to the second etch precursor doses (which follow the first etching precursor). FIGS. 2A-2B show in-situ FTIR spectroscopy of MLD growth of alucone using TMA/EG exposures (FIG. 2A) followed by MLE using LiO$^t$Bu/TMA exposures (FIG. 2B).

The etching process may utilize precursors such that it is selective to only remove either the organic or inorganic-organic coating. For example, where alucone is deposited on $Al_2O_3$, the etching is selective to alucone over $Al_2O_3$. The etching stops when all the alucone is removed and the underlying $Al_2O_3$ is exposed. That is, the combination of LiO$^t$Bu+TMA, for example, only removes the MLD layer and does not affect the inorganic material.

Experiments suggest that all mass loss occurs during the TMA pulses. However, the etching process requires both precursors; etching terminates when either EG or TMA is suspended. The FTIR in FIG. 3 shows saturation in absorbance changes versus both TMA and LiO$^t$Bu dose times (self-limiting chemistry for both of the MLE steps).

As described further in the Experiments section, experiments were undertaken to grow aluminum metal-organic films (alucone) using MLD of TMA and EG. FIG. 1A shows the observed mass increase associated with the TMA/EG cycles. FIG. 2A illustrates in-situ FTIR spectroscopy corresponding to the increasing amount of alucone with successive numbers of deposition cycles. Conversely, the experiments observed a decrease in the amount of alucone by MLE (LiO$^t$Bu and TMA exposure) measured by mass (FIGS. 1A-1B) and by FTIR (FIG. 2B).

Additionally, experiments were done to test the impact of temperature on the MLE process. FIG. 4A illustrates ex-situ measurements demonstrating MLE of alucone films with 38 nm starting thickness. MLE was performed using LiO$^t$Bu/TMA exposures at the temperatures specified (160° C., 200° C. and 266° C.). It was observed that the etch rate is temperature-dependent. The experiments demonstrated MLE of alucone at etch rates of 4 Angstrom/cycle at 160° C. to 36 Angstrom/cycle at 266° C. The etch rate increases as temperature increases. The temperature may be up to the decomposition temperature of the precursors. This MLE process can be used as described to etch metal-organic layers in semiconductor/microelectronic manufacturing processes and enable new fabrication pathways.

Figure 6:
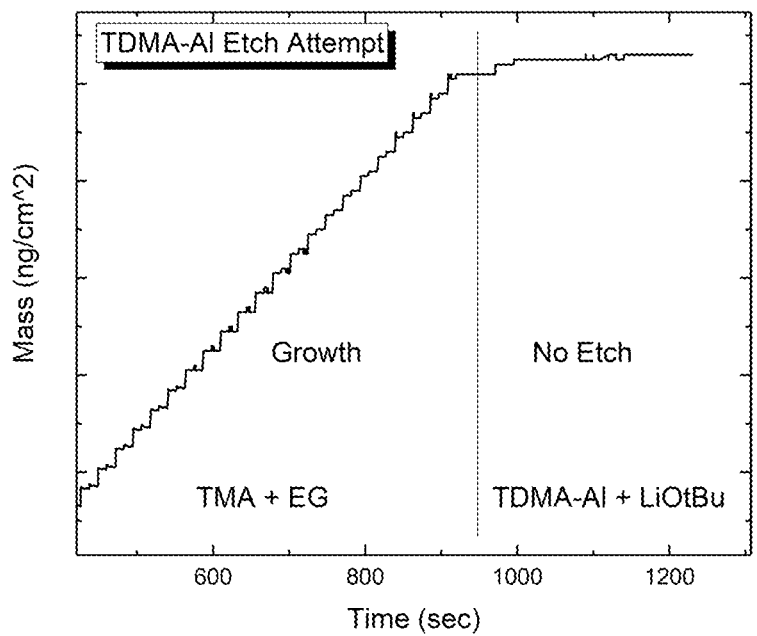
FIG. 6 illustrates the metal center dependence.

FIGS. 5A-5D show etching demonstrated on four types of M-cones. The etching rate is dependent on the type of M-cone. FIG. 6 illustrates the metal center dependence. To check to see if other metal ion precursors can etch surface, alternative aluminum precursor ("TDMA-Al") was tested. No etching was observed.

In one embodiment, the temperature dependence can be exploited for patterned etching using selective localized heating (e.g., laser heating). The temperature dependence of the etch rate also suggests the possibility of patterned etching by local heating of specific regions of the substrate to be etched (e.g., using a laser) to achieve small feature sizes of desired form. In this conceived embodiment, the gas phase precursors are exposed to the substrate in the same fashion as above, but engineered temperature variation across the surface of the substrate gives rise to a patterned etch.

The ability to etch MLD materials, particularly organic or hybrid inorganic materials, such as M-cone, films could allow such films to be used as nanoscale sacrificial resist layers in conventional semiconductor device manufacturing, for organic semiconductor applications, or for micro- and nano-scale electromechanical machines ("MEMS" and "NEMS"). In contrast to ALE etching processes which largely require the use HF, the MLE process described herein is halogen-free, using organometallic vapors rather than harsh halogens. In addition to the added safety afforded by avoiding HF, the low elastic modulus of M-cone films relative to metal oxides may also allow MLD films to be applied as sacrificial layers for flexible electronics device manufacturing. Furthermore, the ability to selectively etch MLD layers without impacting ALD layers will allow a pathway for fabrication of small mechanical feature sizes during semiconductor device manufacturing by selectively etching the MLD films using MLE. This could be used as for precise etching of low-dielectric constant ("low-k") interlayer dielectrics, for precise removal of lithography mask layers, or to synthesize novel organic or hybrid nanomaterials.

Experiments

Experiments were undertaken for an etching process that employs sequential self-limiting exposures of LOS and TMA precursors. The experiments employ QCM work to demonstrate: (a) etching of alucone films preloaded with LOS upon TMA exposures and (b) layer-by-layer etching of alucone films using alternating exposures of LOS and TMA. Experiments also identified selectivity of these etching mechanisms. The mechanism was probed for the layer-by-layer etching of alucone using QCM and FTIR spectroscopy and identifies that etching proceeds via heterolytic cleaving of Al—O bonds in alucone upon LOS exposure, followed by methylation to produce volatile species upon TMA exposure. The etching process results in the removal of 0.4 nm/cycle of alucone at 160° C. and up to 3.6 nm/cycle of alucone at 266° C. in ex situ etching experiments on silicon wafers. This halogen-free etching process enables etching of MLD films and provides new fabrication pathways for the control of material geometries at the nanoscale.

Reaction Conditions.

All reactions were carried out in custom hot-walled viscous flow ALD reactors. Argon carrier gas (Ar, Airgas, 99.999%) was employed at a base pressure of ~1.0 Torr. The conductance and pumping speed varied among the reactors used for this study, giving rise to different carrier gas flow rates among reactors between 165-270 sscm. TMA (Strem, 98%) and water (deionized to an ionic resistance of 18.2 MΩ) precursors were held at room temperature and delivered via a virtual valve dosing scheme. EG (Sigma-Aldrich, 99.8% anhydrous) was held at 65-80° C., tertbutanol ("HO$^t$Bu," Sigma-Aldrich, 99.8% anhydrous) was held at 35-50° C., and LiO$^t$Bu (Sigma-Aldrich) and LiHMDS (Sigma-Aldrich, 97%) were both held at 105-120° C. EG, HO$^t$Bu, LiO$^t$Bu, and LiHMDS temperatures were maintained using cast aluminum jacketed heaters and delivered via a flow-over bubbler design.

QCM Studies.

QCM measurements were performed at 150° C. 5 MHz gold-plated QCM crystals were loaded into an ALD QCM Sensor (Inficon). Prior to performing QCM measurements, the QCM crystal was kept in the reactor overnight to reach a steady-state temperature, and maintained within ±0.2° C. of the setpoint using PID temperature controllers on the reactor body. Mass changes were benchmarked using ALD growth of $Al_2O_3$ via TMA/$H_2O$ to confirm a mass gain per cycle ("MGPC") of ~40 ng/cm$^2$/cycle prior to deposition.

FTIR Spectroscopy.

A smaller ALD reactor integrated with a Nicolet 6700 FTIR spectrometer (Thermo Scientific) was used to perform all in situ FTIR measurements. Details of the design has been reported earlier. Each spectrum was collected over an average of 256 scans between 400 and 400 cm$^{-1}$ wavenumber with a 4 cm$^{-1}$ resolution. All measurements were carried out in the absorbance mode. A steel mesh loaded with $ZrO_2$ nanoparticles was used as substrate placed between the IR beam and the liquid $N_2$ cooled DTGS detector to study precursor adsorption with each half ALD cycle.

Results.

The results present evidence of the chemical mechanism, which enables MLE during QCM experiments studying the incorporation of lithium into metal organic or M-cone films. The process is shown to improve the lithium ionic conductivity of MLD films deposited using TMA and EG ("AlEG") by incorporating lithium oxide ("$LiO_x$") using doses of $LiO^tBu$ and $H_2O$ to form a $LiO_x$/AlEG laminate. Presented in FIG. 7A is QCM data collected during an attempt to deposit this $LiO_x$/AlEG laminate. For the second TMA dose (following the first dose of $LiO^tBu$) in FIG. 7A, we observed a sharp spike in mass of 48 ng/cm$^2$ with an exponential decrease in mass by 18 ng/cm$^2$ over 10 s until the subsequent EG dose. This behavior is not observed in prior reports on alucone growth or lithium aluminum oxide growth but was repeated for each TMA dose during the remainder of growth in FIG. 7A. At a time of about 300 s following the start of the experiment (after the first 5 cycles of TMA:EG:$LiO^tBu$:$H_2O$) in FIG. 7A, each precursor was dosed multiple times back-to-back without dosing other precursors (five times each for TMA and EG and ten times each for $LiO^tBu$ and $H_2O$) to evaluate precursor saturation behavior. During the successive pulses of EG, $LiO^tBu$, and $H_2O$, typical saturation behavior was observed as expected for self-limiting growth. However, during the five successive TMA pulses, a decrease in mass was observed upon each of the five successive pulses of TMA, with an overall decrease in mass of 65.8 ng/cm$^2$.

It is hypothesized that the mass loss observed upon TMA exposure may have originated from residual $O^tBu^-$ ligands in the alucone film as have been observed in prior work. Upon dosing TMA, residual $O^tBu^-$ ligands in the film may exchange for methyl groups from TMA, leading to a decrease in mass. In an effort to circumvent this process, a second LOS precursor, LiHMDS, was employed as used in prior work and is depicted in the inset if FIG. 7B. Fewer hexamethyldisilizane ("$HMDS^-$") ligands would remain in the film after LiHMDS doses because (a) $HMDS^-$ ligands are expected to form weaker bonds to surface Al* (N in $HMDS^-$ is less electronegative than the O in $O^tBu^-$ and (b) the $HMDS^-$ is expected to be more sterically hindered for nucleophilic attack on surface Al* groups than $O^tBu^-$. The electronegativity difference of these two ligands is reflected in the pKa values of $HO^tBu$ and HMDS, where HMDS has a lower pKa than $HO^tBu$ owing to α-silyl stabilization. The growth behavior of a $LiO_x$/alucone laminate using LiHMDS is shown in FIG. 7B. However, as can be seen, a mass decrease is still occurring during five successive TMA doses at a time of 360 s in FIG. 7B when using LiHMDS as a LOS precursor. The mass decrease observed during the TMA doses when using the $LiO^tBu$ precursor (65.8 ng/cm$^2$) is larger than when using the LiHMDS precursor (22.7 ng/cm$^2$), suggesting that the LiHMDS may have prevented some mass loss. Additionally, because the $HMDS^-$ ligand is more massive (160 g/mol) than the $O^tBu^-$ ligand (74 g/mol), the smaller mass loss observed using the LiHMDS precursor corresponds to 84% less ligand exchange on a molar basis. These data suggests that the use of $HMDS^-$ may be reducing the mass loss or etching effect.

Following these observations, investigations were undertaken into what extent this etching behavior would proceed upon TMA doses—whether it was limited to the removal of just a small fraction of the film mass or whether etching would continue with additional TMA doses. To evaluate this, 120 successive TMA doses were performed following 15 growth cycles of TMA:EG:Li-precursor:$H_2O$ and the mass changes were measured by QCM, as presented in FIG. 8. The mass on the QCM crystal continued to decrease with each successive TMA dose. When TMA doses were stopped for short intervals (e.g., at a time of 270 s in FIG. 8), the mass decrease also stopped and resumed only when TMA doses resumed. The initial masses of the films deposited using 15 growth cycles were 578.3 ng/cm$^2$ using the $LiO^tBu$ precursor and 752.5 ng/cm$^2$ using the LiHMDS precursor. After 120 TMA doses, we observed overall mass decreases of 441.6 ng/cm$^2$ and 374.8 ng/cm$^2$, corresponding to a loss of 76.4% and 49.8% of the initial film thickness for films grown using the $LiO^tBu$ precursor and LiHMDS precursor, respectively. The film grown with LiHMDS exhibited less etching than the film grown with $LiO^tBu$, in line with the removal of residual ligands as we hypothesized. However, the magnitude of the etching we observe for the film grown using $LiO^tBu$ (>75% of film mass etched) cannot be accounted for by the removal of residual ligands alone. Even if all of the EG in the alucone film were removed, this would only account for a 56% decrease in mass corresponding to the conversion of $Al_2(OC_2H_4O)_3$ to $Al_2O_3$—about 20% less mass loss than observed using $LiO^tBu$.

Figure 9A:
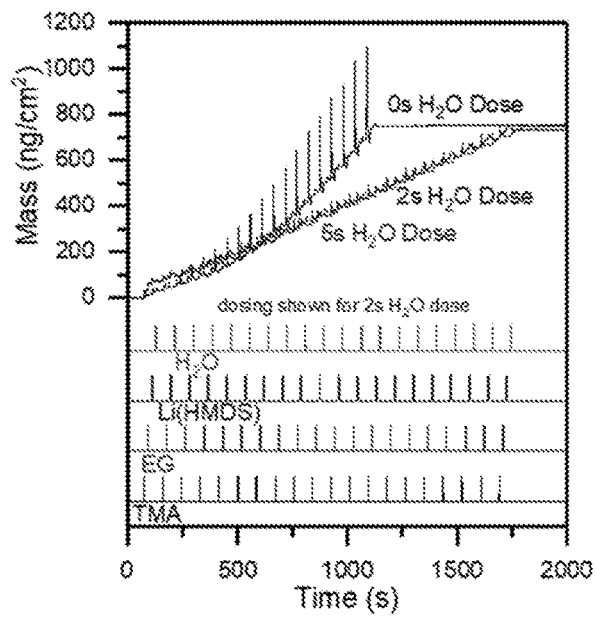
FIGS. 9A-9B illustrate the impact of water dose in TMA:EG:LiHMDS:H$_2$O growth cycles on film etching during subsequent TMA exposures.
Figure 9B:
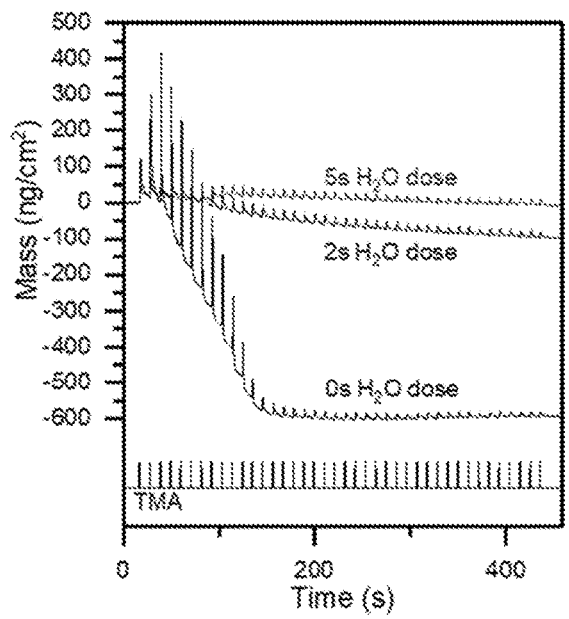

Comparing the observations in FIGS. 1A-1B and 2A-2B with prior literature reports, the etching behavior is believed to be unique to the combination of EG, TMA, and Li precursors used here. The growth of alucone using TMA/EG and of lithium aluminum oxide using TMA:$H_2O$:$LiO^tBu$:$H_2O$ are both well-studied, and no etching was observed for these processes. Based on the prior report studying the growth of lithium aluminum oxide, introducing more water during the growth may suppress the etching phenomenon. FIG. 9A is an overlay of three QCM traces of 20 growth cycles using TMA:EG:LiHMDS:$H_2O$ with $H_2O$ dose times of 0 s (no dose), 2 s, and 5 s. The total time for growth is significantly shorter with no $H_2O$ dose owing to the removal of the $H_2O$ purge time with no $H_2O$ dose. For each of these samples, the final mass gain after 20 growth cycles is roughly equivalent at ~750 ng/cm$^2$ (751 ng/cm$^2$, 731 ng/cm$^2$, and 748 ng/cm$^2$ for the 0 s, 2 s, and 5 s water dose conditions respectively). Following 20 growth cycles, 40 successive TMA exposures were performed and measured the resulting mass change as depicted in FIG. 9B. For the film grown using no water dose (FIG. 9A), subsequent TMA exposures (FIG. 9B) produced film etching of 594 ng/cm$^2$, or 79% of the film mass lost after 40 TMA doses, whereas when using a 5 s water dose in each growth cycle (FIG. 9A), only 7 ng/cm$^2$ of etching, or 1% film mass loss, was observed in subsequent TMA exposures (FIG. 9B). Additionally, employing a 2 s water dose during growth slowed (but did not stop) the etching process to produce only 13% film mass loss after 40 subsequent TMA doses. The data in FIGS. 9A-9B indicate that $H_2O$ doses prevent the etching phenomenon perhaps because $H_2O$ doses lead to the formation of aluminum and/or lithium oxides which are insusceptible to etching. The film etching resulting in 79% removal of the alucone films grown with interspersed LiHMDS doses further verifies that the removal of residual ligands does not account for the etching behavior observed.

A correlation was observed between the intensity of the mass spikes upon TMA dose in FIG. 9A and the severity of etching upon TMA exposure in FIG. 9B. The spikes in mass upon TMA exposure without any $H_2O$ dose are up to >400 ng/cm² in height, with no such spikes observed upon TMA exposure for the film grown with a 5 s $H_2O$ dose. While the origins of the mass spikes are unknown at this time, they may indicate the absorption of the TMA precursor into the bulk alucone film as observed during TMA/$H_2O$ growth onto poly(methyl methacrylate) ("PMMA") polymer films.

Based on the data in FIGS. 9A-9B, it is believed that introducing LOS precursors during alucone growth makes the alucone film susceptible to etching by TMA. The LOS precursor is a significant difference between the experiments conducted in FIGS. 9A-9B and prior reports on MLD growth using TMA/EG where no etching was observed. It is believed that the LOS acts to weaken the alucone structure and allows for etching. The most straightforward explanation of this is that the LOS (e.g., LiHMDS) heterolytically cleaves Al—O bonds in R—Al—$OC_2H_4O$—Al—R to form, for example, R—Al-HMDS and Li—$OC_2H_4O$—Al—R groups. Then upon TMA exposure, —$CH_3$ and —Al$(CH_3)_x$ ligands act to release these groups and form volatile species. The specific mechanism for this etching behavior merits further study outside of the scope of this work, but based on this hypothesized mechanism, may include volatile compounds (e.g., $(CH_3)_2$—Al-HMDS, $CH_3$—Al—$(HMDS)_2$, and Al$(HMDS)_3$; Li—$OC_2H_4O$—Li, Li—$OC_2H_4O$—Al—$(CH_3)_2$, (Li—$OC_2H_4O)_2$—Al—$CH_3$, and (Li—$OC_2H_4O)_3$Al; or $LiCH_3$, and $CH_3$—Al—$O_2C_2H_4$). The formation of larger molecular weight species by linking two Al centers is also possible (e.g., (Li—$OC_2H_4O$)—Al—$(OC_2H_4O)_2$—Al—$(OC_2H_4O$—Li)). These larger molecular weight species are expected to have lower vapor pressures than the smaller molecules listed above. However, this general scheme, including larger molecular weight leaving groups, is consistent with reaction schemes observed during ALE and the removal of surface blocking species. The HMDS⁻ ligands written in all of the potential volatile species we list above may be replaced with $O^tBu^-$ ligands to produce a series of analogous potential volatile species for etching processes using $LiO^tBu$ precursors.

Based on the etching observations in FIGS. 7A-9B, it is believed that one can take advantage of the etching behavior arising from the combination of TMA and LOS precursors to etch MLD M-cone films even when no lithium was present in the film as-grown. It is expected that the same etching mechanisms observed in FIGS. 7A-9B above may occur at the surface of a MLD M-cone film if we introduce exposure cycles consisting of LOS precursors and TMA. In this proposed scheme, the lithium organic precursor salt (e.g., $LiO^tBu$) would dissociate on the surface of the MLD film. Upon TMA exposure, methyls transfer to surface atoms, which are bound to the constituents of the lithium salt precursor, volatilizing them and leading to film etching.

To evaluate whether we can achieve MLE of a M-cone film with no lithium in the film as-grown, 10 growth cycles were performed of TMA/EG to deposit alucone onto a QCM crystal and then performed 67 $LiO^tBu$:TMA etch cycles, as depicted in FIG. 1A. The initial growth of TMA/EG agrees with prior literature reports with an average MGPC of 32 ng/cm²/cycle over these 10 MLD cycles. When $LiO^tBu$ and TMA are dosed, the mass begins to decrease. After 10 $LiO^tBu$:TMA etching cycles, the dosing is paused for >2 minutes at a time of 829 s in FIG. 1A, and the mass change does not continue to decrease until the $LiO^tBu$ and TMA doses resume. $HO^tBu$:TMA dose was plotted as a red trace in FIG. 1A and saw no etching behavior (instead observing some growth), suggesting that the $O^tBu^-$ ligand alone is not sufficient for etching and that Li is required for etching. MLE was also attempted using $LiO^tBu$ and tris(dimethylamido)aluminum rather than TMA and observed no etching (not shown). Additionally, $LiO^tBu$ doses were replaced with TMA doses during 20 etching cycles at a time of 1224 s in FIG. 1A, and we observed that the rate of change in mass diminishes during this period, indicating self-limiting behavior for the etching. In FIG. 1B, the total cumulative mass change during the 40 TMA doses is plotted starting a time of 1224 s, and observed as self-limiting behavior for the etching behavior during TMA exposures, where the mass change plateaus to a value of −40 ng/cm²/cycle. When $LiO^tBu$ is introduced again, the etch rate increases upon subsequent TMA exposure, indicating that doses of both $LiO^tBu$ and TMA must be repeated for the etching process to continue. Using this etching method, the removal of 95% of the alucone film grown using TMA/EG is observed, with only 13 ng/cm² of mass remaining after etching.

To better understand the chemical processes leading to the mass loss observed in FIGS. 1A-1B, FTIR was performed in operando during MLD of alucone using TMA and EG followed by MLE using $LiO^tBu$ and TMA. During growth, an increase in absorbance was observed with an increasing number of alucone growth cycles in FIG. 2A. A range of peaks are seen in FIG. 2A, which are in agreement with prior studies of alucone growth. These include the peak at 905 cm⁻¹ from Al—O stretching vibrations, and peaks at 1086 cm⁻¹ and 1132 cm⁻¹ from C—O and C—C stretching vibrations, respectively. A range of features (at 1192 cm⁻¹, 1255 cm⁻¹, 1354 cm⁻¹, etc.) associated with the $CH_2$ twist and $CH_2$ wag modes in the EG chain are also seen. Following 50 growth cycles of TMA/EG, we then performed 50 etch cycles using $LiO^tBu$ and TMA. The FTIR data collected in operando during the etch cycles is presented in FIG. 2B. During etching, the absorbance of all peaks decreases with increasing $LiO^tBu$:TMA cycles. After 50 etch cycles, some features are still present in the FTIR spectrum, indicating that the alucone film has not been entirely removed from the powder $ZrO_2$ substrate. The incomplete removal of 50 alucone growth cycles following 50 etch cycles is consistent with the behavior observed in FIGS. 1A-1B, where 100 etch cycles were required to remove 10 growth cycles of alucone film. Additionally, limited diffusion into the $ZrO_2$ powder may restrict the extent of etching on the FTIR samples over that observed on flat samples.

Both the data in FIG. 1A and FIG. 2B indicate the etching slows as the film thickness decreases. The data in FIG. 1A show that the etch rate using $LiO^tBu$:TMA starts as high as 15 ng/cm²/cycle during the first ten etching cycles, and then decreases to <5 ng/cm²/cycle during the removal of the final etch cycles. This behavior is also reflected in FIG. 2B, where the absorbance of the feature at 1100 cm⁻¹ decreases from 0.33 to 0.18 over the first 10 $LiO^tBu$:TMA cycles but only decreases from 0.10 to 0.08 between the 40$^{th}$ and 50$^{th}$ $LiO^tBu$:TMA cycles. This may arise because alucone growth using EG results in double-reacted EG molecules, which block some surface sites, leading to a lower density film on the surface than in the bulk. A lower density alucone on the surface may allow for rapid diffusion of the TMA and Li salt precursors into the film during initial etching, but then as the film is etched, the more dense alucone is exposed which etches more slowly.

Figure 10:
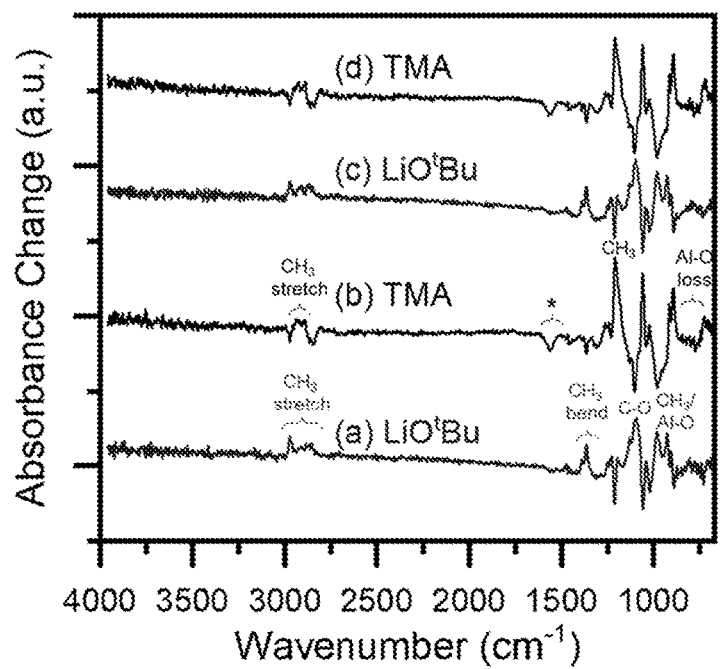
FIG. 10 shows FTIR difference spectra for successive doses of LiO$^t$Bu and TMA during MLE of alucone.

FIG. 10 illustrates the FTIR difference spectra obtained during individual doses of $LiO^tBu$ and TMA during MLE in FIG. 2B. The dominant features which appear upon $LiO^tBu$ exposures in FIG. 10 exhibit symmetric, reversible, flip-flop behavior when alternating between $LiO^tBu$ and TMA doses, as discussed below, indicating reversible chemical transformations. Upon $LiO^tBu$ exposures, an increase is seen in features at 1366 cm$^{-1}$ and 1390 cm$^{-1}$—which correspond to the CH$_3$ bending modes in O$^t$Bu$^-$—and at 2840-3000 cm$^{-1}$—which corresponds to CH$_3$ stretching modes in the O$^t$Bu$^-$ ligand, suggesting that O$^t$Bu$^-$ is present on the film surface following LiO$^t$Bu exposure. We also observe a feature at 1095 cm$^{-1}$ in FIG. 10 that LiO$^t$Bu exposures corresponds to the vibrational frequency of the C—O stretching mode observed in alucone and a feature at 1131 cm$^{-1}$, which corresponds to the vibrational frequency of the C—O stretching mode observed in HO$t$Bu molecules. These two features also indicate that O$^t$Bu$^-$ ligands are present on the film surface following LiO$^t$Bu doses. We also observe features at 925 cm$^{-1}$ and 978 cm$^{-1}$ upon LiO$^t$Bu exposures, which may be associated with rocking modes of CH$_3$ groups in O$^t$Bu$^-$ ligands or with Al—O stretch in alucone, perhaps arising from the formation of Al—O groups with O from O$^t$Bu$^-$. During subsequent TMA exposures (FIG. 10, TMA exposures B and D), we see the removal of all of the O$^t$Bu$^-$ features, which were introduced during the LiO$^t$Bu dose except for select CH$_3$ stretch modes, as described further below. These data indicate that O$^t$Bu$^-$ ligands are introduced into the film during LiO$^t$Bu exposure and are released from the film upon TMA exposure. This FTIR data is consistent with the mechanism proposed above in which LiO$^t$Bu dissociates on the surface of the alucone and heterolytically cleaves Al—O bonds in R—Al—OC$_2$H$_4$O—Al—R to form R—Al-HMDS and Li—OC$_2$H$_4$O—Al—R surface groups.

FTIR data acquired upon TMA exposures following LiO$^t$Bu exposures shows an indication that CH$_3$ groups are accumulating in the film during the LiO$^t$Bu:TMA etch process. During TMA exposures, a distinct 0.01 increase is seen in absorbance at 1209 cm$^{-1}$—which corresponds to a deformation mode of CH$_3$ groups bound to Al—paired with an increase at 2900-2940 cm$^{-1}$—which corresponds to the symmetric and asymmetric stretches for CH$_3$ bound to Al. These features are in agreement with other work on TMA exposures to polymers. However, the increase in absorbance at 1209 cm$^{-1}$ upon TMA dose is only partially reversed upon the next LiO$^t$Bu exposure; less than 60% of the peak height is reflected as a decrease in absorbance at 1209 cm$^{-1}$ upon subsequent LiO$^t$Bu exposure. Additionally, an increase above the background for the CH$_3$ stretch region from 2900-2940 cm$^{-1}$ during both TMA and LiO$^t$Bu exposures is seen. The persistence of these two features suggests accumulation of CH$_3$ in the polymer film during etching. The accumulation of methyl groups in the film is also reflected in the overall absorption data in FIGS. 1A-1B. The ratio in absorbance of the CH$_3$ deformation feature at 1209 cm$^{-1}$ versus the absorbance in the C—C region at 1086 cm$^{-1}$ is ~0.5 following 50 TMA:EG growth cycles in FIG. 1A and ~1.0 following 50 subsequent LiO$^t$Bu:TMA etch cycles in FIG. 1B, indicating a relative increase in CH$_3$ concentration versus C—C concentration in the film and supporting the conclusion that CH$_3$ groups are accumulating in the film. Accumulation of methyl groups in the surface upon TMA exposure is also consistent with prior reports on ALE of Al$_2$O$_3$ using TMA and HF.

A decrease in absorbance is also seen in the region from 800-1000 cm$^{-1}$ following TMA exposures in FIG. 10. This region is characteristic of Al—O bonding and suggests that Al—O bonds are heterolytically cleaved during the TMA dose, leading to etching. This is consistent with QCM observations where the mass loss occurs during the TMA dose and with the mechanism proposed above in which surface Al atoms within Al-O$^t$Bu and Li—OC$_2$H$_4$O—Al—R groups are methylated upon TMA exposure to generate volatile leaving groups.

Figure 11:
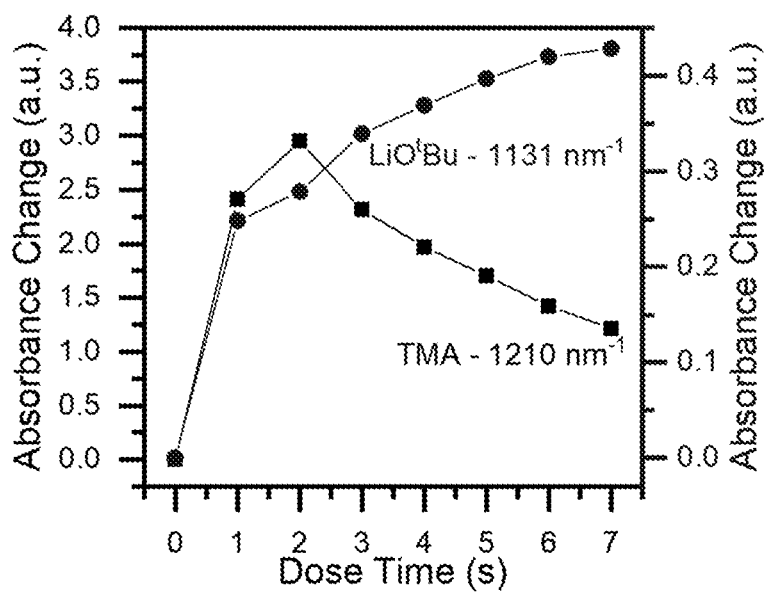
FIG. 11 shows FTIR absorbance change versus dose time for TMA and LiO$^t$Bu doses during etching of alucone.

Further, the saturation behavior of these precursors was reviewed by examining the absorbance changes with varying precursor dose times. FIG. 11 presents the cumulative absorbance change of peaks at 1131 cm$^{-1}$ during seven sequential 1 s LiO$^t$Bu doses and at 1209 cm$^{-1}$ during seven sequential 1 s TMA doses. These peaks were selected because they were the most prominent features observed in FIG. 10 during each precursor exposure. Here, during LiO$^t$Bu doses, the absorbance for the feature at 1131 cm$^{-1}$ (corresponding to the C—O bond in O$^t$Bu$^-$) increases with increasing LiO$^t$Bu exposure. The rate of increase in absorbance at 1131 cm$^{-1}$ slows after about 2 s of LiO$^t$Bu exposure, indicating some degree of self-limiting behavior. Continued slow diffusion of Li$^+$ and O$^t$Bu$^-$ into the bulk of the alucone film with longer LiO$^t$Bu exposure leads to the "soft" saturation behavior we observe. Conversely, during the TMA exposures, we observed that the absorbance for the prominent CH$_3$ deformation feature at 1209 cm$^{-1}$ increases during the first 2 s of exposure and then begins to decrease with a somewhat constant slope up to 7 s of exposure. This decrease in absorbance of the CH$_3$ deformation feature between 2-7 s of TMA exposure arises because the methylated surface of the alucone film is etching away after 2 s of TMA exposure resulting in a net loss of CH$_3$. In FIG. 1B, the TMA exposure results in self-limiting behavior over 40 s of dose time based on mass changes during QCM measurements. In FIG. 11, TMA was dosed for only 7 s, and the curve shape does not match that observed in FIG. 1B. The gravimetric data in FIG. 1B are a better indicator of self-limiting behavior during TMA dose than the spectroscopic data in FIG. 11 due to the loss of surface species upon etching.

Based on the in-situ QCM and FTIR data presented above, it is expected that one will be able to remove alucone films from silicon substrates with nm-scale resolution using LiO$^t$Bu:TMA etching. Ex-situ etching of alucone from silicon wafers is demonstrated in FIGS. 4A-4B. For these experiments, 200 TMA:EG growth cycles were used to deposit alucone on a series of ~1"×1" silicon wafers, resulting in a total average thickness of 377±8 Å for all samples. These alucone-coated silicon wafers were transferred to an argon-filled glovebox (<1 ppm H$_2$O) connected directly to the ALD reactor used for alucone growth. The samples were stored in the argon-filled glovebox to limit water exposure. Water exposure is expected to prevent MLE, as depicted in FIG. 9A-9B. Three samples at a time were placed back into the ALD reactor attached to the glovebox and varying numbers of LiO$^t$Bu/TMA etching cycles were performed at one of three different temperatures: 160° C., 200° C. and 266° C., as depicted in FIG. 4A. Following etching, the silicon wafers were removed from the reactor, then transferred out of the argon-filled glovebox. Final film thicknesses were characterized using spectroscopic ellipsometry promptly after transferring each sample out of the glovebox environment.

A decrease in film thickness was observed at each tested temperature with increasing LiO$^t$Bu/TMA cycles where the etch rate increased with increasing temperature. At 160° C., the etch rate corresponds to ~4 Å/cycle, at 200° C. the etch rate corresponds to ~10 Å/cycle, and at 266° C. the etch rate corresponds to ~36 Å/cycle. Assuming an alucone density of 1.5 g/cm$^3$, these etch rates correspond to ~60 ng/cm$^2$/cycle, ~150 ng/cm$^2$/cycle, and ~540 ng/cm$^2$/cycle for 160° C., 200° C. and 266° C., respectively. These etch rates are higher than the etch rate of 15 ng/cm$^2$/cycle observed at 150° C. in FIGS. 1A-1B above. This lower etch rate for the QCM studies is related to differences in the delivery of the LiO$^t$Bu precursor between the two experiments. The LiO$^t$Bu was undersaturated during the initial QCM experiments in FIGS. 1A-1B and improvements in the LiO$^t$Bu precursor delivery provided saturating LiO$^t$Bu doses as discussed above. Based on the etch rates observed in FIG. 4A, an Arrhenius analysis arrived at a thermal activation barrier for the etching process in FIG. 4B. This analysis resulted in a predicted activation barrier of 0.46 eV (11 kcal/mol). It is suspected that diffusion barrier of Li$^+$ and O$^t$Bu$^-$ and/or TMA into the bulk of the film limits the extent of etching and drives the increased etch rate at higher temperatures. The activation barrier of TMA complexation with PMMA was calculated in prior reports consistent with the energy observed in the experiments and suggests TMA hopping is the barrier to etching.

Potential applications for MLE include precise removal of lithography mask layers (photo/DUV/e-beam), precise etching of low-k interlayer dielectrics, MEMS/NEMS, and fabrication of organic or hybrid nanomaterials.

Definitions

No claim element herein is to be construed under the provisions of 35 U.S.C. § 112(f), unless the element is expressly recited using the phrase "means for."

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

It should be noted that the term "exemplary" and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

The term "coupled" and variations thereof, as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic. For example, circuit A communicably "coupled" to circuit B may signify that the circuit A communicates directly with circuit B (i.e., no intermediary) or communicates indirectly with circuit B (e.g., through one or more intermediaries).

The term "or," as used herein, is used in its inclusive sense (and not in its exclusive sense) so that when used to connect a list of elements, the term "or" means one, some, or all of the elements in the list. Conjunctive language such as the phrase "at least one of X, Y, and Z," unless specifically stated otherwise, is understood to convey that an element may be either X, Y, Z; X and Y; X and Z; Y and Z; or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

References herein to the positions of elements (e.g., "top," "bottom," "above," "below") are merely used to describe the orientation of various elements in the FIGURES. It should be noted that the orientation of various elements may differ according to other exemplary embodiments, and that such variations are intended to be encompassed by the present disclosure.

Although the figures and description may illustrate a specific order of method steps, the order of such steps may differ from what is depicted and described, unless specified differently above. Also, two or more steps may be performed concurrently or with partial concurrence, unless specified differently above.

What is claimed is:

1. A method of etching an organic/inorganic hybrid coating on a inorganic substrate, comprising:
    performing an etching cycle comprising:
        a first half reaction exposing a first etching precursor comprising a gaseous lithium precursor to the coating on the substrate at a first half reaction temperature, the coating being selected from the group consisting of an organic coating and an organic-inorganic coating; and
        a second half reaction exposing a second etching precursor, which comprises trimethylaluminum, to the coating at a second half reaction temperature; and
    removing a portion of the organic/inorganic coating;
    wherein the first etching precursor is selected from the group consisting of lithium tert-butoxide (LiO$^t$Bu) and lithium hexamethyldisilizane (LiHMDS), and
    wherein performing the etching cycle does not comprise flowing water to react with the first etching precursor or the second etching precursor.

2. The method of claim 1, wherein the first half reaction temperature and the second half reaction temperature are between 150° C. and 300° C.

3. The method of claim 1, wherein the organic/inorganic coating is a metalcone.

4. The method of claim 3, wherein the metalcone is alucone.

5. The method of claim 1, wherein the inorganic substrate is Al$_2$O$_3$.

6. The method of claim 1, wherein the removing is at a rate of 4-40 Angstrom/cycle.

7. The method of claim 1, wherein the substrate is nonreactive with the first etching precursor and the second etching precursor.

8. The method of claim 1, wherein the gaseous lithium precursor and the second etching precursor are non-reactive with the substrate.

9. The method of claim 1, wherein the etching is at an etching temperature of 150° C. to 300° C.

10. A method of forming an object comprising:
performing an alucone deposition cycle comprising:
  exposing a first deposition precursor to the substrate,
  exposing a second deposition precursor to the substrate, and
  repeating the deposition cycle N times, forming an alucone coating on the substrate;
performing an etching cycle comprising:
  a first half reaction exposing a first etching precursor comprising a lithium precursor to the alucone coating on the substrate, and
  a second half reaction exposing a second etching precursor, which comprises an organometallic, to the alucone coating; and
removing a portion of the alucone coating;
wherein the first etching precursor is selected from the group consisting of lithium tert-butoxide (LiO$^t$Bu) and lithium hexamethyldisilizane (LiHMDS), and
wherein performing the etching cycle does not comprise flowing water to react with the first etching precursor or the second etching precursor.

11. The method of claim 10, wherein the first half reaction temperature and the second half reaction temperature are between 150° C. and 300° C.

12. The method of claim 10, wherein the inorganic substrate is $Al_2O_3$.

13. The method of claim 10, wherein the removing is at a rate of 4-40 Angstrom/cycle.

14. The method of claim 10, wherein the substrate is nonreactive with the first etching precursor and the second etching precursor.

15. The method of claim 10, wherein the first etching precursor and the organometallic are non-reactive with the substrate.

* * * * *